(12) United States Patent
Cyr et al.

(10) Patent No.: US 10,277,112 B2
(45) Date of Patent: Apr. 30, 2019

(54) PHYSICAL TOPOLOGY FOR A POWER CONVERTER

(71) Applicant: TM4 Inc., Boucherville (CA)

(72) Inventors: Jean-Marc Cyr, Candiac (CA); Mohammed Amar, Montréal (CA); Maalainine El Yacoubi, Montréal (CA); Pascal Fleury, Sainte-Madeleine (CA)

(73) Assignee: TM4, Inc., Boucherville, QC (CA)

( * ) Notice: Subject to any disclaimer, the term of this patent is extended or adjusted under 35 U.S.C. 154(b) by 0 days.

(21) Appl. No.: 15/738,314

(22) PCT Filed: Jun. 16, 2016

(86) PCT No.: PCT/CA2016/050702
§ 371 (c)(1),
(2) Date: Dec. 20, 2017

(87) PCT Pub. No.: WO2016/205929
PCT Pub. Date: Dec. 29, 2016

(65) Prior Publication Data
US 2018/0183321 A1    Jun. 28, 2018

Related U.S. Application Data

(60) Provisional application No. 62/183,437, filed on Jun. 23, 2015.

(51) Int. Cl.
*H01L 23/48*        (2006.01)
*H02M 1/32*         (2007.01)
(Continued)

(52) U.S. Cl.
CPC .......... *H02M 1/32* (2013.01); *H01L 23/3675* (2013.01); *H01L 23/3735* (2013.01);
(Continued)

(58) Field of Classification Search
CPC ....... H01L 23/5386; H01L 2224/48091; H01L 2924/13055; H01L 2924/14251;
(Continued)

(56) References Cited

U.S. PATENT DOCUMENTS

2008/0084642 A1    4/2008  Kato et al.
2008/0151580 A1    6/2008  Schlecht
(Continued)

FOREIGN PATENT DOCUMENTS

WO    2013082705    6/2013
WO    2014043795    3/2014
(Continued)

OTHER PUBLICATIONS

Bödeker, C. et al., Investigation of an overvoltage protection for fast switching silicon carbide transistors, IEEE IET Power Electronics, Dec. 2015, vol. 8 Issue 12, pp. 2336-2342.
(Continued)

*Primary Examiner* — Gary L Laxton
(74) *Attorney, Agent, or Firm* — Marshall & Melhorn, LLC

(57) ABSTRACT

A physical topology for receiving top and bottom power electronic switches comprises a top collector trace connected to a positive voltage power supply tab and having a connection area for a collector of a top power electronic switch, a bottom emitter trace connected to a negative voltage power supply tab and having a connection area for an emitter of the bottom power electronic switch, and a middle trace connected to a load tab and having a connection area for an emitter of the top power electronic switch and a connection area for a collector of the bottom power electronic switch. Sampling points are provided on the traces for voltages on the emitters of the top and bottom power electronic switches, on the trace for voltage of the collector
(Continued)

of the bottom power electronic switch, and on the negative voltage power supply tab. The topology defines parasitic inductances.

16 Claims, 9 Drawing Sheets

(51) Int. Cl.
| | | |
|---|---|---|
| H02M 1/08 | (2006.01) | |
| H02M 7/00 | (2006.01) | |
| H02M 7/538 | (2007.01) | |
| H01L 23/367 | (2006.01) | |
| H01L 23/373 | (2006.01) | |
| H01L 23/538 | (2006.01) | |
| H01L 23/00 | (2006.01) | |
| H01L 25/18 | (2006.01) | |
| H02M 3/158 | (2006.01) | |
| H02M 7/5387 | (2007.01) | |
| H02M 3/155 | (2006.01) | |
| H02M 1/34 | (2007.01) | |
| H02M 1/00 | (2006.01) | |

(52) U.S. Cl.
CPC .......... *H01L 23/48* (2013.01); *H01L 23/5386* (2013.01); *H01L 24/48* (2013.01); *H01L 25/18* (2013.01); *H02M 1/08* (2013.01); *H02M 3/158* (2013.01); *H02M 7/003* (2013.01); *H02M 7/538* (2013.01); *H01L 2224/0603* (2013.01); *H01L 2224/48091* (2013.01); *H01L 2224/48139* (2013.01); *H01L 2224/48225* (2013.01); *H01L 2224/48227* (2013.01); *H01L 2224/48472* (2013.01); *H01L 2224/49111* (2013.01); *H01L 2224/49113* (2013.01); *H01L 2224/49175* (2013.01); *H01L 2924/1203* (2013.01); *H01L 2924/13055* (2013.01); *H01L 2924/1425* (2013.01); *H02M 3/155* (2013.01); *H02M 2001/0054* (2013.01); *H02M 2001/342* (2013.01); *Y02B 70/1491* (2013.01)

(58) Field of Classification Search
CPC ..... H01L 23/48; H02M 3/158; H02M 3/1588; H02M 7/5387
See application file for complete search history.

(56) References Cited

U.S. PATENT DOCUMENTS

2014/0321178 A1* 10/2014 Cyr .................. H02M 1/08
363/131
2016/0134279 A1* 5/2016 Sicard .................. H03K 17/687
327/109

FOREIGN PATENT DOCUMENTS

| WO | 2014161080 | 10/2014 |
|---|---|---|
| WO | 2015061901 | 5/2015 |
| WO | 2015070344 | 5/2015 |
| WO | 2015070347 | 5/2015 |
| WO | 2015139132 | 9/2015 |

OTHER PUBLICATIONS

PCT International Search Report of International Searching Authority for International Patent Application No. PCT/CA2016/050702, dated Jul. 27, 2016, 4 pages.
PCT Written Opinion of International Searching Authority for International Patent Application No. PCT/CA2016/050702, dated Jul. 27, 2016, 7 pages.

* cited by examiner

PHYSICAL TOPOLOGY FOR A POWER CONVERTER

CROSS REFERENCE TO RELATED APPLICATIONS

This application is a national phase under 35 U.S.C. § 371 of International Application No. PCT/CA2016/050702 filed on Jun. 16, 2016, which claims priority to and benefit of U.S. Provisional Ser. No. 62/183,437 filed on Jun. 23, 2015, and the entirety of each of these applications is incorporated by reference herein.

TECHNICAL FIELD

The present disclosure relates to the field of power electronics. More specifically, the present disclosure relates to a physical topology for building a power converter.

BACKGROUND

Commutation cells are commonly used in electronic systems that require conversion of a voltage source, including both DC-DC converters and DC-AC converters, which are often called inverters. With the limited space allowed for power converter circuits, such as those used for example in electric and/or electric hybrid automotive applications, and given the high cost of the semiconductors, the demand for integration of these commutation cells increases.

A known way of reducing the space occupied by semiconductors in power converter circuits is to increase their efficiency to allow the size of the cooling surface to be reduced.

Losses in power electronic switches present in conventional power converter circuits are mainly caused by two sources: conduction losses and switching losses. One way to reduce switching losses is generally by accelerating turn-on and turn-off of the power electronic switches. However, fast turn-off of the power electronic switches generates overvoltage in stray inductances of their high-frequency loop. It is thus often required to slow down the turn-off of the power electronic switches to protect them against overvoltage. This may seriously impact the overall efficiency of conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14, which may be a resistive load, an electric motor, and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10, of the load 14, and of the voltage source 12, in which energy flows from the voltage source 12 to the load 14, i.e. from left to right on the drawing. The commutation cell 10 can also be used in a reverse configuration in which energy flows in the opposite direction.

When turned on, the power electronic switch 18 allows current to pass therethrough, from its collector 22 to its emitter 24; at that time, the power electronic switch 18 can be approximated as a closed circuit. When turned off, the power electronic switch 18 does not allow current to pass therethrough and can be approximated as an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high", the power electronic switch 18 allows passing of current from the collector 22 to the emitter 24. When the voltage applied between the gate 26 and the emitter 24 is "low", the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ce}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types, for example bipolar transistors, the term "gate" may be replaced with "base", the base being controlled by a current as opposed to the gate that is controlled by a voltage. These distinctions do not change the overall operation principles of the commutation cell 10.

FIG. 2 is another circuit diagram of the conventional commutation cell of FIG. 1, showing parasitic (stray) inductances. In contrast with the idealized model of FIG. 1, connections between components of an actual commutation cell define parasitic inductances. Though the parasitic inductances are distributed at various places within the commutation cell 10, a suitable model presented in FIG. 2 shows two (2) distinct inductances representing the overall parasitic inductance, including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop because its current remains fairly constant through the commutation period.

FIG. 3 is a circuit diagram of an IGBT leg formed from two commutation cells. More specifically, two commutation cells 10 introduced in the above description of FIGS. 1-2, in which IGBTs are used as power electronic switches, are connected in a single loop and form an IGBT leg 50 powered with the voltage source 12 and capacitor 54. A first power electronic switch (bottom IGBT $Q_1$) operates in tandem with a first freewheel diode (top freewheel diode $D_2$) and a second power electronic switch (top IGBT $Q_2$) operates in tandem with another freewheel diode (bottom freewheel diode $D_1$). Each of the top and bottom IGBTs $Q_1$, $Q_2$ may actually include a plurality of parallelized IGBTs that are combined to provide additional power. Likewise, each of the top and bottom freewheel diodes $D_1$, $D_2$ may include a plurality of parallelized diodes. Parallelization of the IGBTs and of the diodes is not shown on FIG. 3 in order to simplify the illustration. In the context of the present disclosure, the terms "top" and "bottom" do not refer to a physical position of electronic devices in a circuit; these terms only refer to positions of electronic devices in a schematic representation as exemplified in FIG. 3. For example, without limiting the present disclosure, a device is considered located at the "top" when it is connected closer (in electrical terms) to a positive voltage source than to a negative voltage source. A device may be considered located at the "bottom" when it is connected to a negative voltage source with a lower impedance than to a positive voltage source.

Each IGBT has its own gate driver 52. A voltage source 12 provides a voltage $V_{bus}$ in parallel to an input capacitance 54 ($C_{in}$) connected to the IGBT leg 50 via a parasitic inductance $L_c$. Inductances inherently provided in wires, connections, decoupling capacitor and circuit board traces of a power converter have been represented in FIG. 3. A three-phase power converter used for powering a three-phase electric motor (not shown) from a battery (also not shown), would comprise three (3) IGBT legs 50 as shown on FIG. 3. Since such power converters are believed well-known to those skilled in the art, they are not described in further details herein.

When the bottom IGBT $Q_1$ is turned off, current transits from the bottom IGBT $Q_1$ to the top freewheel diode $D_2$, during an overvoltage period. Indeed, various parasitic inductances ($L_c$, $L_{+Vbus}$, $L_{c\text{-}top}$, $L_{e\text{-}top}$, $L_{c\text{-}bot}$, $L_{e\text{-}bot}$ and $L_{-Vbus}$) present in a high frequency loop 51, formed by the IGBT leg 50 and the input capacitance 54, resist change of current therein, additive voltages develop in the high frequency loop 51 as illustrated by the polarities of the parasitic inductances shown on in FIG. 3. These voltages, added to the voltage $V_{bus}$ of the source, often result in a voltage exceeding the maximal collector to emitter voltage $V_{ce}$ rating of the bottom IGBT $Q_1$. The top IGBT $Q_2$ is subject to the same problem.

Conventional solutions aim to limit overvoltage in power electronic switches by slowing down the slope of the gate-emitter voltage. However, excessive limitation of the overvoltage can imply longer switching times of the current, reducing commutation cell performance.

As can be seen from FIG. 3, the IGBT leg 50 has resistive dividers connected across some of the parasitic (stray) inductances of the high frequency loop 51. The IGBT leg 50 uses a compensation circuit that optimizes overvoltage on the IGBTs $Q_1$, $Q_2$ using the resistive dividers. Discussing the bottom portion of the IGBT leg 50 of FIG. 3, the bottom IGBT $Q_1$ includes a parasitic collector inductance $L_{c\text{-}bot}$, a parasitic emitter inductance $L_{e\text{-}bot}$. The gate 26 of the bottom IGBT $Q_1$ connected to its gate driver 52 via a resistor $R_1$. A reference 56 of the gate driver 52 is connected to a compensation circuit having a resistive divider circuit including two resistors $R_2$ and $R_3$ and, optionally, a diode $D_3$ that may be added to allow the turn-on not to be impacted by shorting the resistor $R_2$ when a voltage at the emitter of the bottom IGBT $Q_1$ is higher than the reference 56. If present, the diode $D_3$ is conducting while turning on the IGBT $Q_1$ because the direction of the current in the IGBT $Q_1$ causes a voltage to be higher at the emitter 24 than at the reference 56. In contrast, the diode $D_3$ is not conducting while turning off the IGBT $Q_1$ because a drop of voltage at the emitter 24 causes application of a negative voltage across the diode $D_3$. It is to be noted that while the resistors $R_2$ and $R_3$ are shown connected across both parasitic inductances $L_{e\text{-}bot}$ and $L_{-Vbus}$, they may alternatively be connected solely across parasitic inductance $L_{e\text{-}bot}$, should this parasitic inductance be sufficient and the connection available.

In the circuit of FIG. 3, values of the resistors $R_2$ and $R_3$ are selected according to an acceptable overvoltage level allowed across the bottom IGBT $Q_1$. A ratio of $R_2$ over $R_3$ is increased to reduce the overvoltage. The value of these two resistors $R_2$ and $R_3$ in parallel is set, in series with a gate driver resistor $R_1$. A value of the gate driver resistor $R_1$ is adjusted in a conventional manner according to a proper commutation behavior.

Values of the resistors of the compensation circuits are set to reduce the overvoltage caused by the presence of the emitter inductance on the IGBTs $Q_1$, $Q_2$. It is desired to tailor the overvoltage in order to reach the maximum IGBT rating while maintaining the speed of the di/dt for efficiency reasons. The voltage across the emitter parasitic inductance is thus split in two and only the voltage across the logical resistor is applied in the gate drive circuit to limit the gate voltage drop.

This technique works very well for the bottom IGBT $Q_1$ because the emitter inductance $L_{e\text{-}bot}$ is sufficiently large to provide good overvoltage sampling. In contrast, for the top IGBT $Q_2$, the emitter inductance $L_{e\text{-}top}$ often has a too small value to suitably clamp a voltage thereacross without increasing the gate resistor $R_4$, to protect the top IGBT $Q_2$. In practice, the emitter inductance $L_{e\text{-}top}$ of the top IGBT $Q_2$ is very often too low to be used to bring down the overvoltage across the top IGBT $Q_2$ to a safe level.

FIG. 4 is a schematic representation of a typical topology for an IGBT module. FIG. 5 is a top plan view of an actual IGBT module having the topology of FIG. 4, the IGBT module including a circuit card and a casing. Referring at once to FIGS. 4 and 5, a conventional IGBT module 100 includes a first set of parallelized IGBT 102 defining the top IGBT $Q_2$ of FIG. 3 and their associated diodes 104, a second set of parallelized IGBT 106 defining the bottom IGBT $Q_1$ and their associated diodes 108, a +Vbus tab 110, a −Vbus tab 112 and a load tab 114. Elements of the IGBT module 100 are mounted on a direct bonded copper (DBC) substrate 101. Because of the constraints on packaging of IGBT modules, the upper and lower IGBTs and diodes are often packaged in close proximity of each other, as shown on FIGS. 4 and 5.

In the example of FIGS. 4 and 5, four (4) IGBTs 102 are placed in parallel to form the top IGBT $Q_2$ while four (4) more IGBTS 106 are placed in parallel to form the bottom IGBT $Q_1$ of FIG. 3. Likewise, the top freewheel diode $D_2$ and the bottom freewheel diode $D_1$ are each realized as sets of four (4) parallelized diodes 104, 108. On FIGS. 4 and 5, the IGBTs and diodes are connected to traces of the DBC substrate 101. The tabs 110, 112 and 114 are mounted on the DBC substrate 101, itself mounted in a casing 103. On FIGS. 4 and 5, collectors 22 of the various IGBTs are not visible since they are mounted directly on DBC traces, including a c-top trace 116 and a c-bot trace 122. Emitters 24 are connected via wires 120 to an e-top trace 117 and to an e-bot trace 118 while gates 26 are connected to g-top and g-bot traces via wires 121. Likewise, cathodes of the various diodes are not visible, being directly mounted on the c-top 116 and c-bot 122 traces. Anodes of the various diodes are connected via wires 120 to the e-top 117 and to e-bot 118 traces.

In the IGBT module 100, interconnections made via DBC traces, wire bonds 120, 121 and external connections create the parasitic inductances introduced in the foregoing description of FIG. 3.

The e-bot trace 118 that forms a connection between the emitter 26 of the bottom IGBT $Q_1$ (IGBTs 106) and the external connection of −Vbus tab 112 contains a zigzag pattern that create a fairly large parasitic inductance between these elements. Accordingly, a level of voltage across the emitter inductance $L_{e\text{-}bot}$ of the bottom IGBT $Q_1$ can be injected in the gate driver 26 to of the bottom IGBT $Q_1$ using the compensation circuit of FIG. 3 to create a negative voltage at its emitter 24, adequately slowing down the negative slope of the gate voltage.

In contrast, the wire bonds 120 interconnecting the emitter of the top IGBT $Q_2$ (IGBTs 102) to the c-bot trace 122 of the bottom IGBT $Q_1$ (IGBTs 106) are quite short. Therefore, the inductance between the emitter of the top IGBT $Q_2$ and the collector of the bottom IGBT $Q_1$ is quite small, in the order of a few nano-Henrys (nH). Accordingly, a level of voltage across the emitter inductance $L_{e\text{-}top}$ of the top IGBT $Q_2$ that can be injected in the gate driver 26 of the top IGBT $Q_2$ using the compensation circuit of FIG. 3 to create a negative voltage at its emitter 24 of the top IGBT $Q_2$ to slow down the negative slope of the gate voltage may be too small to adequately limit the overvoltage of the top IGBT $Q_2$.

The comparatively small value of the upper emitter inductance $L_{e\text{-}top}$ may impact the effectiveness of the solution described hereinabove when applied without additional modification to the top IGBT $Q_2$.

Therefore, there is a need for a topology that provides a better definition of parasitic inductances in power electronic switches.

SUMMARY

According to the present disclosure, there is provided a physical topology for receiving top and bottom power electronic switches, each power electronic switch including a collector, a gate and an emitter. The topology comprises a top collector trace, a bottom emitter trace, and a middle trace. The top collector trace is connected to a positive voltage power supply tab. It includes a connection area for the collector of the top power electronic switch. The bottom emitter trace is connected to a negative voltage power supply tab. It includes a connection area for the emitter of the bottom power electronic switch. The middle trace is connected to a load tab. It includes both a connection area for the emitter of the top power electronic switch and a connection area for the collector of the bottom power electronic switch. Voltage sampling points are provided on the traces. They include a top power electronic switch emitter voltage sampling point located on the middle trace within the connection area for the emitter of the top power electronic switch, a bottom power electronic switch collector voltage sampling point located within a connection area of the middle trace to the load tab, a bottom power electronic switch emitter voltage sampling point located on the bottom emitter trace within the connection area for the emitter of the bottom power electronic switch, and a negative voltage power supply tab sampling point located within a connection area of the bottom emitter trace to the negative voltage power supply tab.

The present disclosure also introduces a power converter, comprising the above-described topology and top and bottom power electronic switches. The power converter also includes a top gate driver having a reference electrically connected to the top power electronic switch emitter voltage sampling point and to the bottom power electronic switch collector voltage sampling point, as well as a bottom gate driver having a reference electrically connected to the bottom power electronic switch emitter voltage sampling point and to the negative voltage power supply tab sampling point The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which.

Like numerals represent like features on the various drawings.

DETAILED DESCRIPTION

Figure 1:
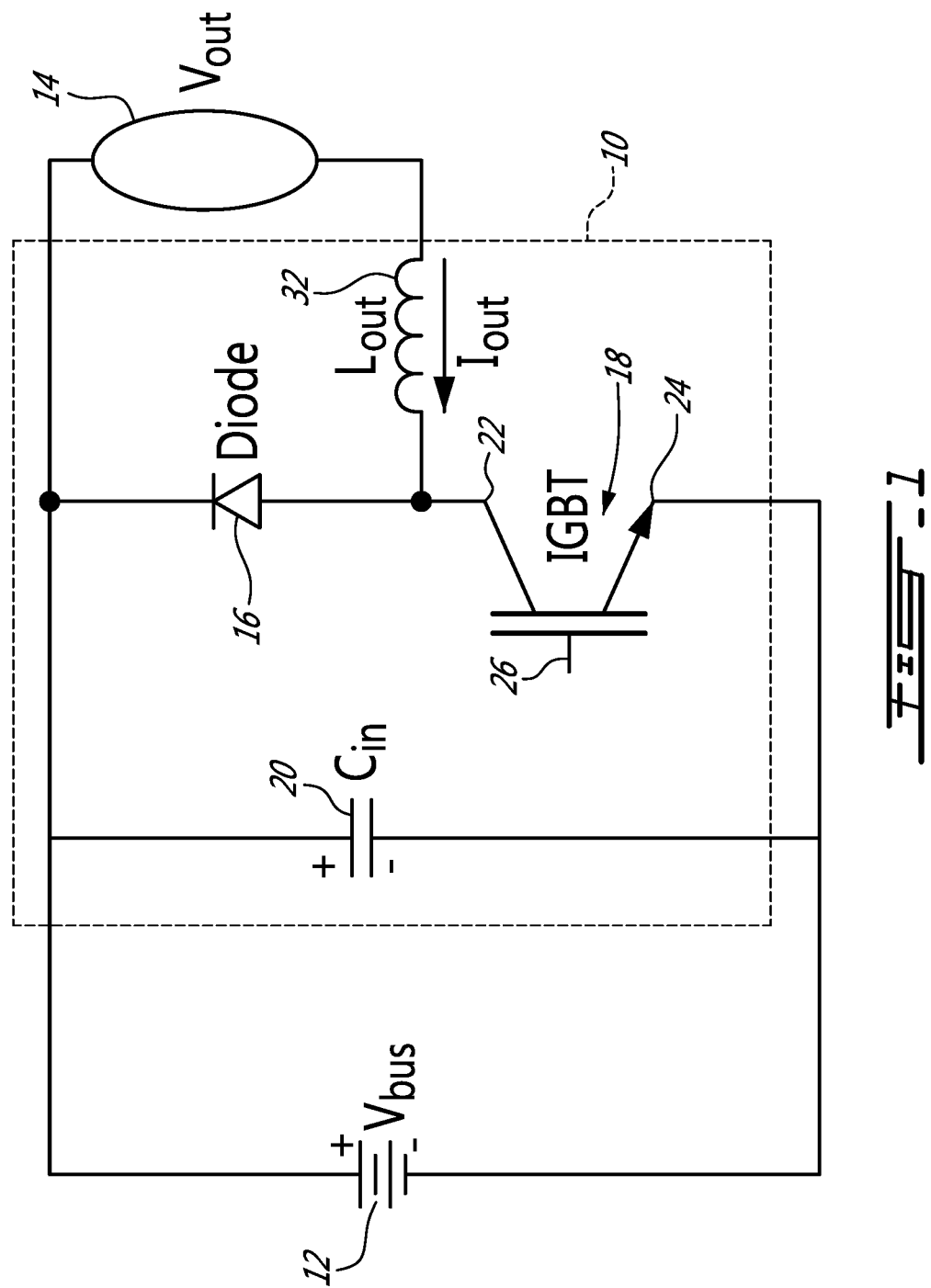
FIG. 1 is an idealized circuit diagram of a conventional commutation cell such as those used in conventional power converter circuits.
Figure 2:
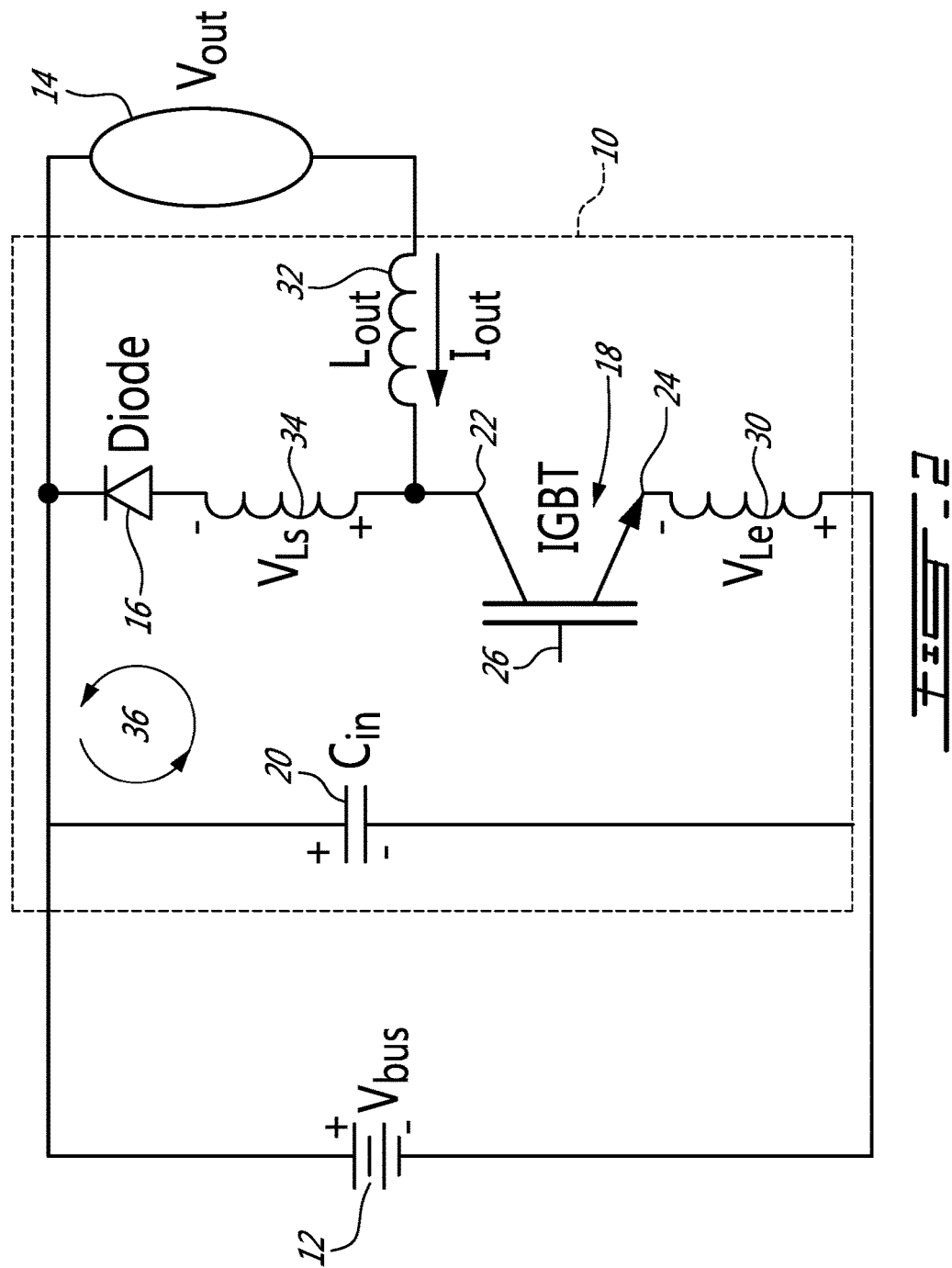
FIG. 2 is another circuit diagram of the conventional commutation cell of FIG. 1, showing parasitic (stray) inductances.
Figure 3:
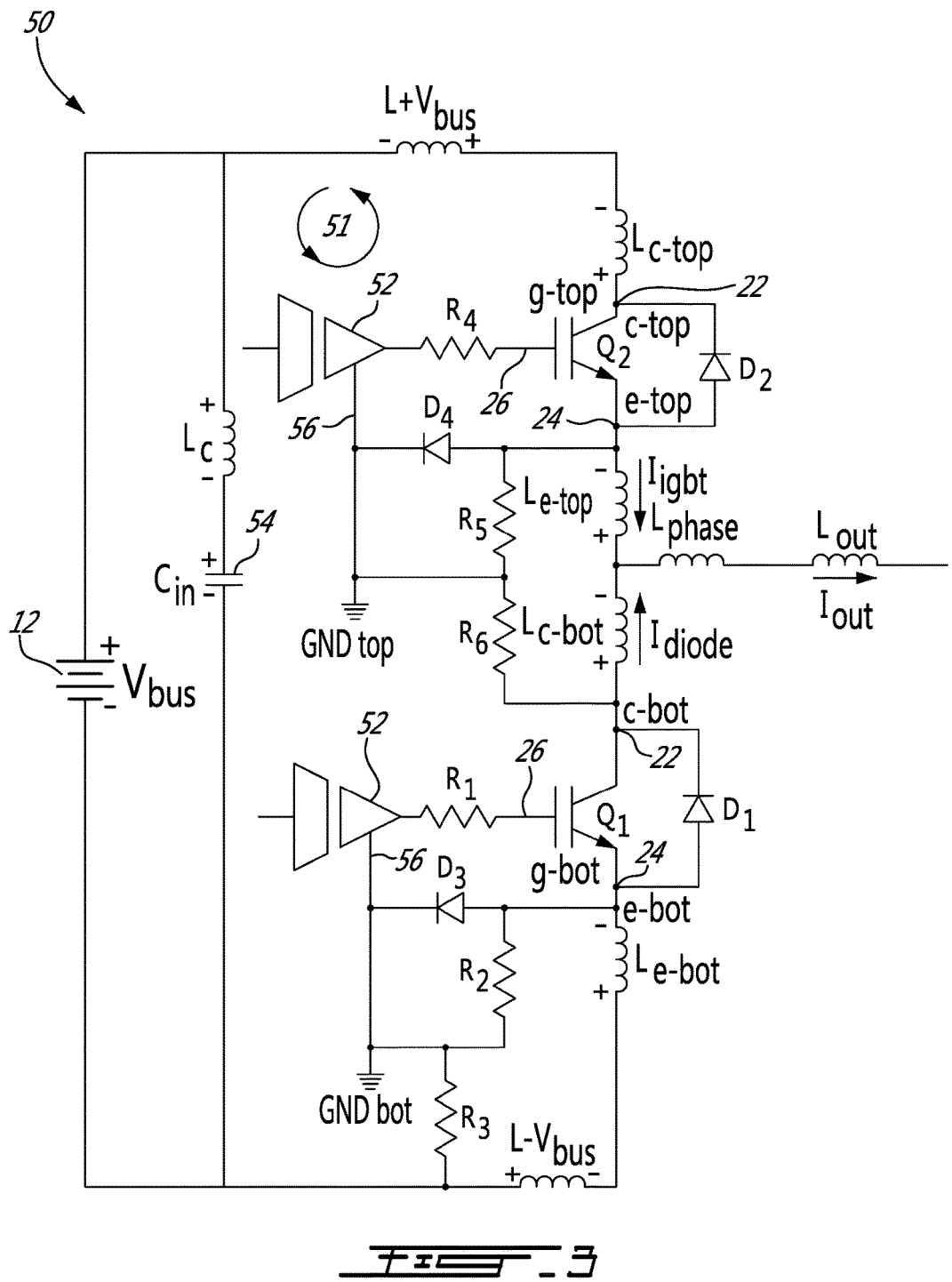
FIG. 3 is a circuit diagram of an IGBT leg formed of two commutation cells.

Various aspects of the present disclosure generally address one or more of the problems of overvoltage present in power converters at the time of switching.

Circuits operable to limit overvoltage in commutation cells, especially at turn-off of IGBTs, are described in international patent publications no WO 2013/082705 A1, WO 2014/043795 and WO 2014/161080 A1, WO 2015/070344 A1, WO 2015/061901 A1, WO 2015/070347 A1 and WO 2015/139132 A1, all of which are authored by Jean-Marc Cyr et al. the disclosure of these being incorporated by reference herein.

The present technology provides control of overvoltage and switching losses at turn-off of a power electronic switch of a power module. Circuits and methods presented herein are generally compatible with other solutions to limit overvoltage at turn-off of power electronic switches.

In a power module, di/dt at turn-off of a power electronic switch generates a voltage across stray inductances of the high frequency loop of the power module. This voltage is applied across the power electronic switch in addition to a bus voltage providing power to the power module. A solution based on the injection of a sample of the overvoltage present across the power electronic switch to a gate driver of the power electronic switch has been proposed. In the case of a pair of power electronic switches connected in series, this solution efficiently controls the overvoltage on a "bottom" power electronic switch. However, a parasitic inductance present between an emitter of a "top" power electronic switch and a collector of the "bottom" power electronic switch may not be sufficient to provide a sufficient sample of the overvoltage present in the top power electronic switch. An improvement comprises defining a new physical topology for mounting power electronic switches, the topology providing a changed definition of parasitic inductances voltage and sampling points for voltages thereacross.

It is to be noted that the expression "parasitic inductance" is used herein and in the appended claims to refer to the inductance created by the connections between the various components of an actual commutation cell. As will be understood from the present disclosure, the voltage generated across some of the parasitic inductances is sampled and used to improve the operation of the commutation cell. Nevertheless, for clarity purpose, these inductances are referred to as parasitic inductances herein.

The techniques disclosed herein will mainly be described in relation to the use of isolated gate bipolar transistors (IGBT). Mentions of IGBTs in the following description are made for illustration purposes and are not meant to limit the present disclosure. The same techniques may equally be applied to power modules constructed using metal-oxide-semiconductor field-effect transistors (MOSFET), bipolar transistors and like controlled power electronic switches.

These techniques provide voltage samples for connection to gate drivers of an IGBT module. Voltages across top and bottom emitter inductances are injected in respective gate drivers to create negative voltages at the emitter of the IGBTs, slowing down the negative slope of $V_{ge}$. The result is a direct action on the gate voltages without any delay in the di/dt limitations.

Figure 6:
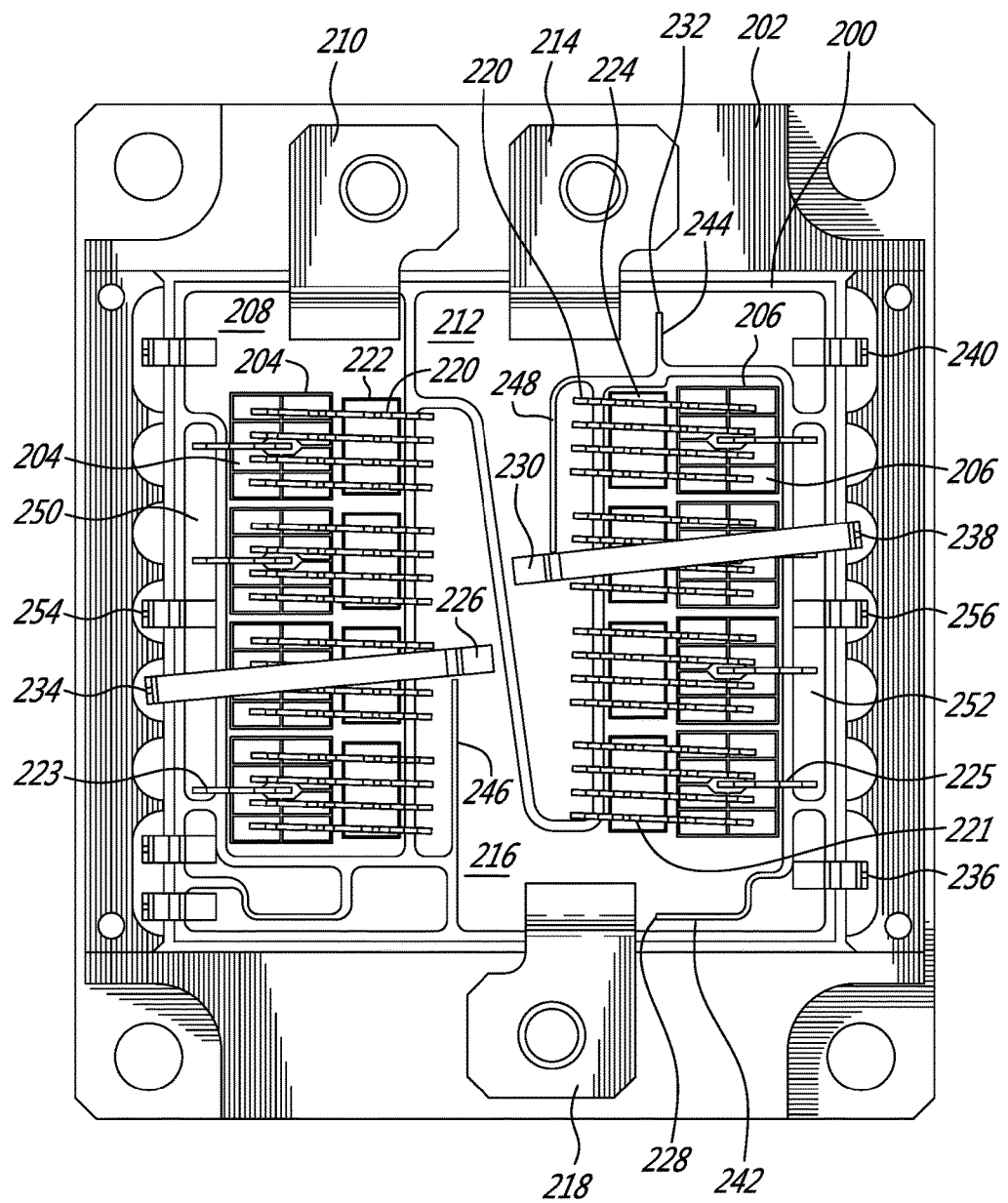
FIG. 6 is a top plan view of an IGBT module according to an embodiment, the IGBT module including a circuit card and a casing.
Figure 7:
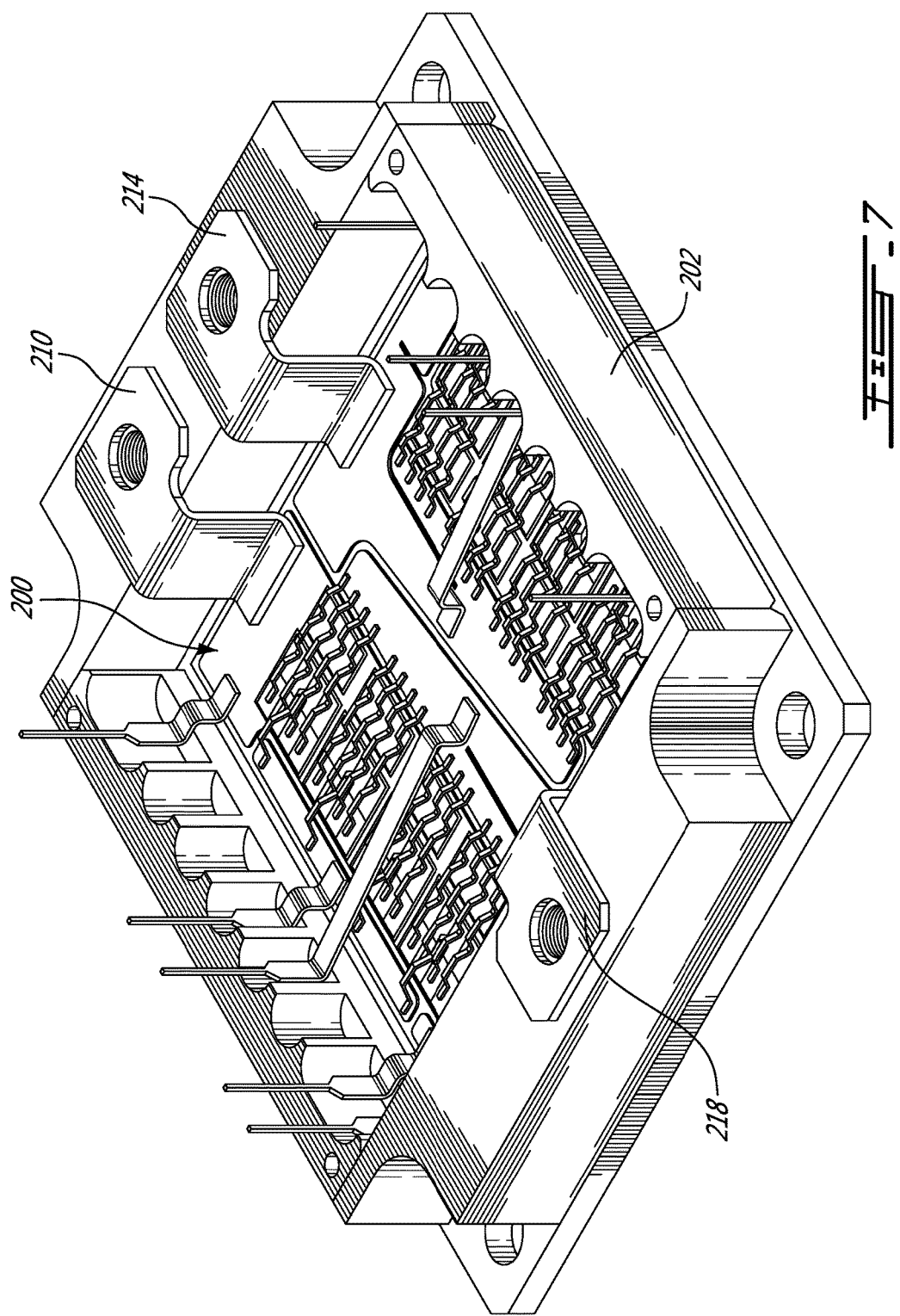
FIG. 7 is a perspective view of the IGBT module of FIG. 6.
Figure 8:
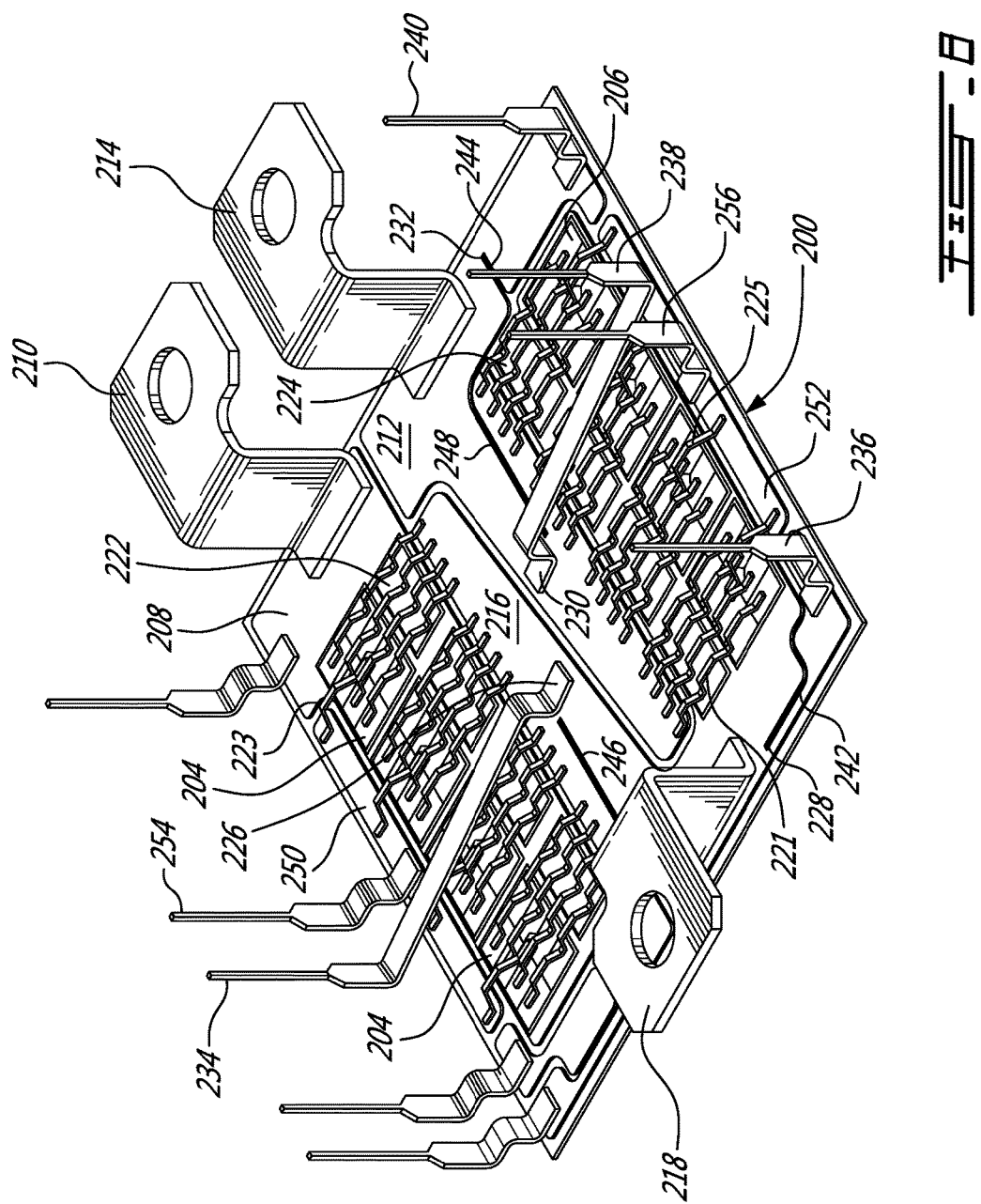
FIG. 8 is a perspective view of the IGBT module of FIG. 6, showing the circuit card and connectors, without the casing.

The present disclosure introduces an improved physical topology that defines parasitic inductances in power electronic switches, for example in an IGBT module. FIG. 6 is a top plan view of an IGBT module according to an embodiment, the IGBT module including a circuit card and a casing. FIG. 7 is a perspective view of the IGBT module of FIG. 6. FIG. 8 is a perspective view of the IGBT module of FIG. 6, showing the circuit card and connectors, without the casing.

Referring at once to FIGS. 6-8, a physical topology 200 is implemented in the form of a card, for example a direct bonded copper (DBC) substrate that can be mounted in a casing 202. The topology 200 is adapted for receiving a top power electronic switch, that optionally include a plurality of parallelized top IGBTs 204, and a bottom power electronic switch, that optionally include a plurality of parallelized bottom IGBTs 206. As expressed hereinabove, each IGBT includes a collector, a gate and an emitter. The topology 200 comprises a top collector trace 208, connected to a positive voltage power supply tab 210. The top collector trace 208 provides a connection area for the collectors of the top IGBTs 204. The topology 200 also comprises a bottom emitter trace 212 connected to a negative voltage power supply tab 214. The bottom emitter trace 212 provides a connection area for the emitters of the bottom IGBTs 206. Also included in the topology 200 is a middle trace 216 connected to a load tab 218 that may be a phase tab in the case of a multiphase embodiment. The middle trace 216 has a connection area for the emitters of the top IGBTs 204 and a connection area for the collectors of the bottom IGBTs 206. Collectors of the top IGBTs 204 are in direct contact with the top collector trace 208 while collectors of the bottom IGBTs 206 are in direct contact with the middle trace 216. Wires 220 connect the emitters of the top IGBTs 204 to the middle trace 216 and wires 221 connect emitters of the bottom IGBTs 206 to the bottom emitter trace 212. Top freewheel diodes 222 are mounted in parallel to the top IGBTs 204 on the top collector trace 208 and bottom freewheel diodes 224 are mounted in parallel to the bottom IGBTs 206 on the middle trace 216. Traces are made of a conductive material, using for example direct bound copper (DBC).

The topology 200 includes four (4) voltage-sampling points. These comprise a top IGBT emitter voltage sampling point 226 located on the middle trace 216 within the connection area for the emitters of the top IGBTs 204, a bottom IGBT collector voltage sampling point located 228 within a connection area of the middle trace 216 to the load tab 218, a bottom IGBT emitter voltage sampling point 230 located on the bottom emitter trace 212 within the connection area for the emitters of the IGBT 206, and a negative voltage power supply tab sampling point 232 located within a connection area of the bottom emitter trace 212 to the negative voltage power supply tab 214.

The sampling points 226, 228, 230 and 232 are respectively connected to pins 234, 236, 238 and 240 that extend from a plane of the card supporting the topology 200 to provide connections to gate drivers (on a later Figure) located on a separate circuit card (not shown). It may be noted that the pins 234 and 238 directly connect, for example by welding, to the sampling points 226 and 230, respectively. On the other hand, the pins 236 and 240 are respectively welded on edges of the middle trace 216 and of the bottom emitter trace 212 and connect to the sampling points 228 and 232 via portions of the middle trace 216 and of the bottom emitter trace 212. Grooves 242 and 244 are provided to isolate strong currents flowing between the bottom IGBTs 206 and the tabs 218 and 214 so that the voltages on the pins 236 and 242 effectively reflect the voltages at the tabs 218 and 214, respectively.

Within the topology 200, the top collector trace 208 forms a top collector inductance ($L_{c\text{-}top}$), generally defined between the connection area for the positive voltage power supply tab 210 and points where the various top IGBTs 204 are mounted on the top collector trace. The bottom emitter trace 216 forms a bottom emitter inductance ($L_{e\text{-}bot}$), generally between the connection area of the emitters of the bottom IGBTs 206, substantially at the bottom IGBT emitter voltage sampling point 230, and the connection area for the negative voltage power supply tab 214. The middle trace 216 forms a top emitter inductance ($L_{e\text{-}top}$), generally between the connection area for the emitters of the top IGBTs 204, substantially at the top IGBT emitter voltage sampling point 226, and the connection area for the load tab 218. The middle trace 216 also forms a bottom collector inductance ($L_{c\text{-}bot}$), generally between the connection area for the load tab 218 and points where the various bottom IGBTs 206 are mounted on the middle trace 216. Without limitation, the top emitter inductance ($L_{e\text{-}top}$) and the bottom emitter inductance ($L_{e\text{-}bot}$) may both be greater than the top collector inductance ($L_{c\text{-}top}$).

Figure 4:
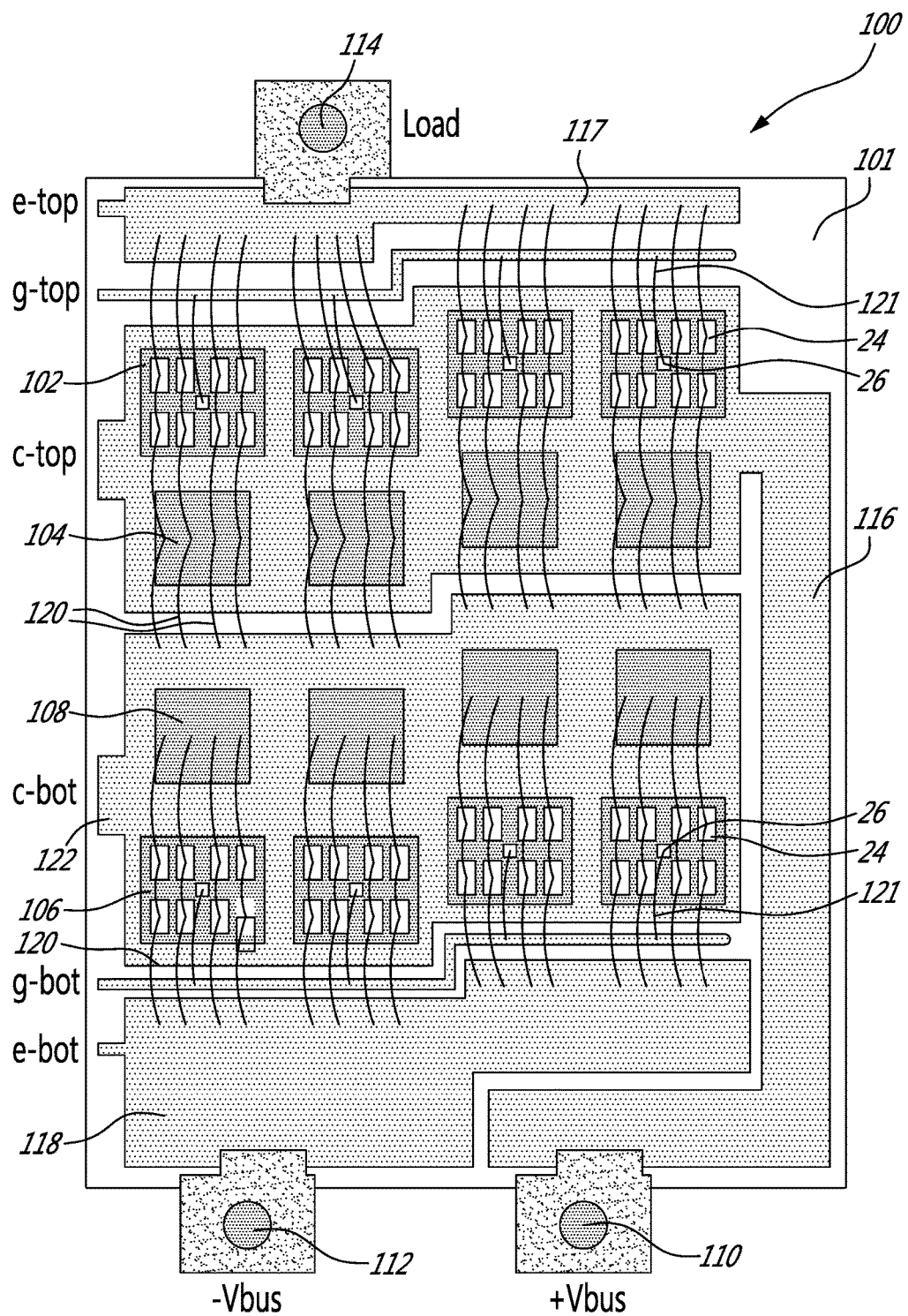
FIG. 4 is a schematic representation of a typical topology for an IGBT module.
Figure 5:
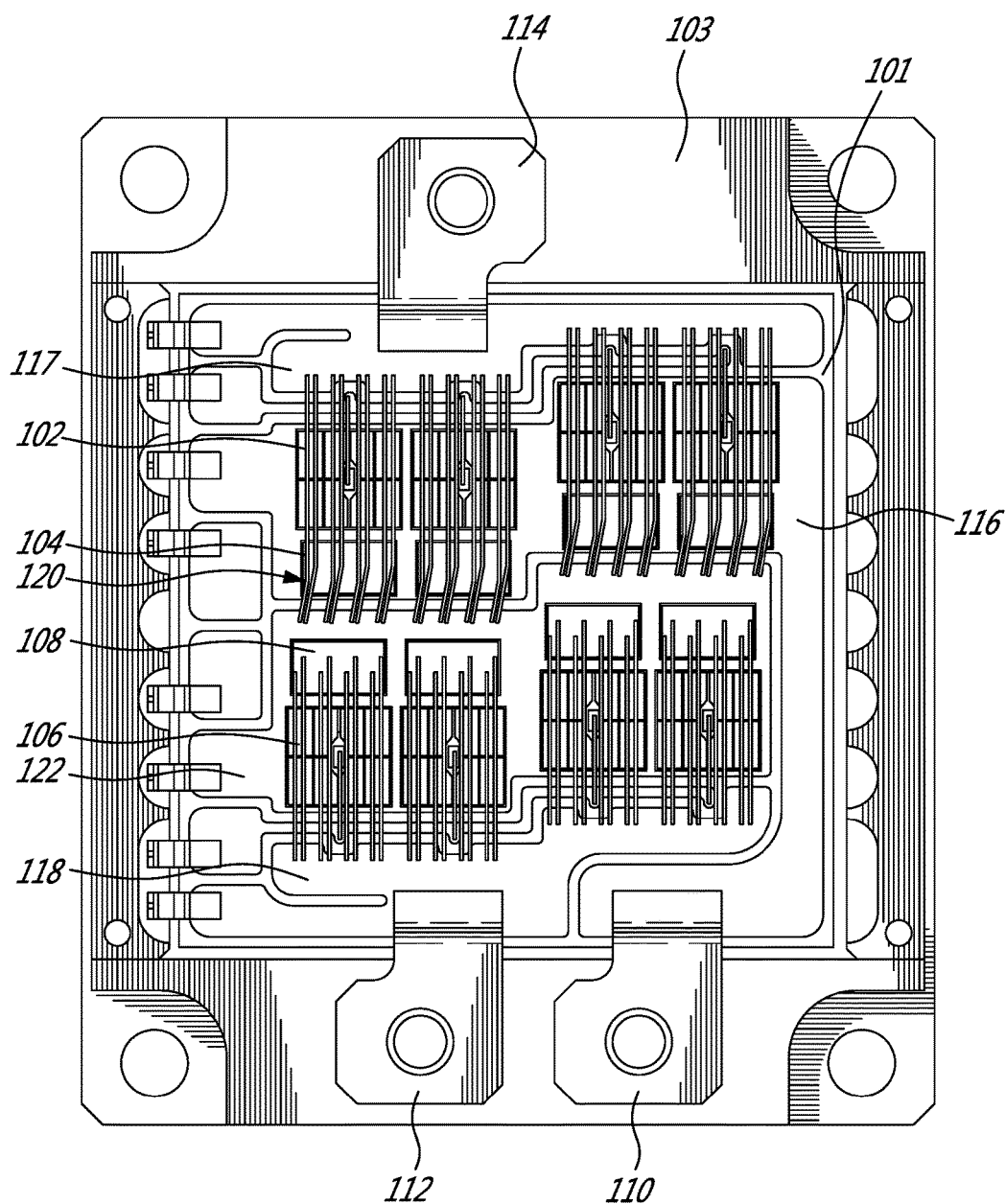
FIG. 5 is a top plan view of an actual IGBT module having the topology of FIG. 4, the IGBT module including a circuit card and a casing.

The disclosed topology, when compared to earlier layouts, provides a reduction of the collector inductance values as well as an increase of the top emitter inductance value. An overall inductance in the high frequency loop of an IGBT leg built using the disclosed topology may, in some embodiments, remain similar to the overall inductance provided in earlier layouts, for example in the layout of FIGS. 4 and 5, so that, resulting switching losses and switching speeds are not significantly impacted. However, because the top emitter inductance is increased, it becomes much easier to configure the application of a voltage, sampled thereacross, to the gate driver of the top power electronic switch.

As shown on FIGS. 6, 7 and 8, emitters of the top IGBTs 204 and the bottom IGBTs 206 are respectively connected to the middle trace 216 and to the bottom emitter trace 212, via wires 220, over fairly broad connection areas. In order to substantially equalize currents in each of the parallelized IGBTs 204 and 206, the middle trace 216 includes a groove 246 leading from the top IGBT emitter voltage sampling point 226 in a direction toward the load tab 218 while the bottom emitter trace 212 includes a groove 248 leading from the bottom IGBT emitter voltage sampling point 230 in a direction toward the negative voltage power supply tab 214. Currents from the IGBT 204 and 206 emitters are driven toward the sampling points 226 and 230 before flowing further to the tabs 218 and 214.

FIGS. 6, 7 and 8 also show a top gate trace 250 configured for connection to the gate of the top IGBTs 204 via wires 223 and a bottom gate trace 252 configured for connection to the gate of the IGBTs 206, via wires 225. Pins 254 and 256 that extend from the plane of the card supporting the topology 200 provide connections to respective top and bottom gate driver outputs (shown on a next Figure).

Figure 9:
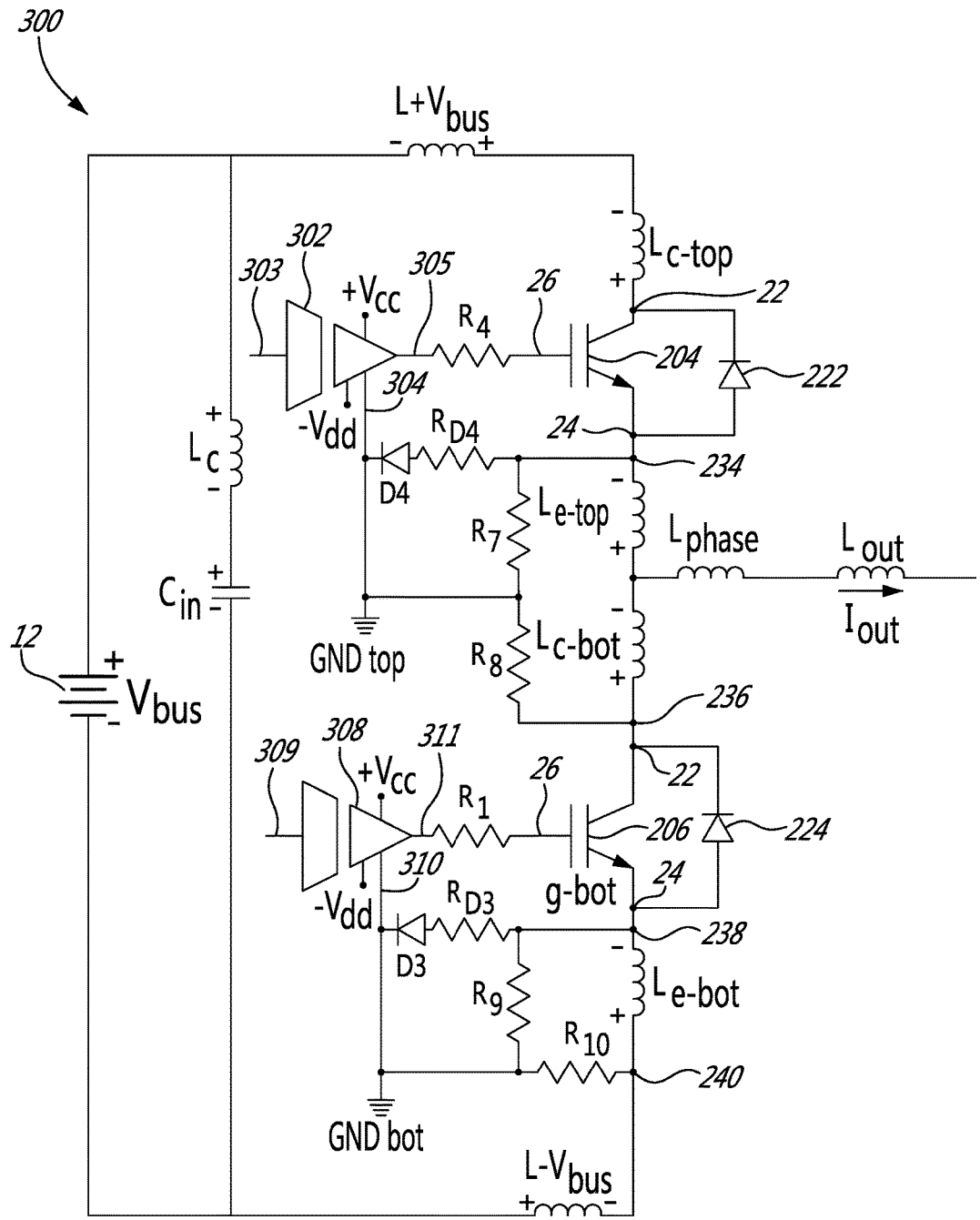
FIG. 9 is a circuit diagram of an IGBT leg adapted for use with the IGBT module of FIG. 6.

The topology 200 can be used as a part of a power converter. FIG. 9 is a circuit diagram of an IGBT leg configured to be used with the IGBT module of FIG. 6. An IGBT leg 300 is schematically illustrated. Some of its elements are mounted on the physical topology 200 of FIGS. 6, 7 and 8 and some other elements of the IGBT leg 300 are mounted on a separate circuit card (not shown) that may for example be mounted atop the casing 202 that encloses the topology 200. The IGBT leg 300 includes the top IGBTs 204, the top freewheel diodes 222, the bottom IGBTs 206 and the bottom freewheel diodes 224, each of which is mounted on the topology 200 and may include a single device or a plurality of parallelized devices. The inductances $L_{c\text{-}top}$, $L_{e\text{-}top}$, $L_{c\text{-}bot}$, and $L_{e\text{-}bot}$ are defined by the traces 208, 212 and 216 of the topology 200, as expressed hereinabove. The inductances $L_{+Vbus}$, $L_{-Vbus}$ and $L_{phase}$ are defined by the positive voltage power supply tab 210, the negative voltage power supply tab 214 and the load tab 218 (also called phase tab in the case of a multiphase embodiment), respectively.

The pins 234, 236, 238 and 240 that extend from the plane of the card supporting the topology 200 are connected on the IGBT leg 300 at the points shown on FIG. 9. A voltage across the top emitter inductance $L_{e\text{-}top}$ is present between pins 234 and 236 and a voltage across the bottom emitter inductance $L_{e\text{-}bot}$ is present between pins 238 and 240.

A top gate driver 302 is fed by a positive voltage supply $+V_{cc}$ and by a negative voltage supply $-V_{dd}$ and has a reference 304. A control signal is fed at an input 303 of the top gate driver 302 to cause an output 305 to reach either of the $+V_{cc}$ above or $-V_{dd}$ below the reference 304, forming signals applied to the gate 26 of the top IGBT 204 via a gate resistor $R_4$. The reference 304 of the top gate driver 302 is connected across gate-emitter in series with the emitter inductance of the top IGBT 204 via a compensation circuit that includes resistors and an optional turn-on diode. The reference 304 is electrically connected to the top IGBT emitter voltage sampling point 226, either directly via the pin 234 or, optionally, via a turn-on diode $D_4$ in series with a resistor $R_{D4}$ and via the pin 234. If present, the turn-on diode $D_4$ is polarized to become short when an emitter voltage of the top IGBT 204 is higher than a voltage of the reference 304. The reference 304 is also electrically connected to the bottom IGBT collector voltage sampling point 228 via a resistor $R_8$ and via the pin 236. A resistor $R_7$ is optionally placed in parallel with the series combination of the turn-on diode $D_4$ with the resistor $R_{D4}$. If the turn-on diode $D_4$ is absent (or equivalently if the resistor $R_{D4}$ has an infinite value), the compensation circuit operates similarly during turn-on and turn-off of the top IGBT 204. If the turn-on diode $D_4$ is present and if the resistor $R_{D4}$ is replaced by a short circuit, there is no compensation at turn-on. In the presence of the turn-on diode $D_4$, selection of a proper value for the resistor $R_{D4}$ allows to fine tune the turn-on of the top IGBT 204 independently from its turn-off, the compensation circuit forming a resistive divider between $R_{D4}$ in parallel with $R_7$, this parallel combination being in series with $R_8$. It is to be noted that resistor $R_7$ may have an infinite value. Resistor $R_7$ is used to fine-tune the circuit, if necessary.

A bottom gate driver 308 is also fed by a positive voltage supply $+V_{cc}$ and by a negative voltage supply $-V_{dd}$ and has a reference 310. A control signal is fed at an input 309 of the bottom gate driver 308 to cause an output 311 to reach either of the $+V_{cc}$ above or $-V_{dd}$ below the reference 310, forming signals applied to the gate 26 of the bottom IGBT 206 via a gate resistor $R_1$. The reference 310 of the bottom gate driver 308 is connected across the emitter inductance of the bottom IGBT 206 via a compensation circuit including resistors and an optional turn-on diode. The bottom gate driver 308 is connected to the bottom IGBT 206 via a compensation circuit including resistors and an optional turn-on diode. The reference 310 is electrically connected to the bottom IGBT emitter voltage sampling point 230, either directly via the pin 238 or, optionally, via a turn-on diode $D_3$ in series with a resistor $R_{D3}$ and via the pin 238. If present, the turn-on diode $D_3$ is polarized to become short when an emitter voltage of the bottom IGBT 206 is higher than a voltage of the reference 310. The reference 310 is also electrically connected to the negative voltage power supply tab sampling point 232 via a resistor $R_{10}$ and via the pin 240. A resistor $R_9$ is optionally placed in parallel with the turn-on diode $D_3$ in series with the resistor $R_{D3}$. If the turn-on diode $D_3$ is absent (or equivalently if the resistor $R_{D3}$ has an infinite value), the compensation circuit operates similarly during turn-on and turn-off of the bottom IGBT 206. If the turn-on diode $D_3$ is present and if the resistor $R_{D3}$ is replaced by a short circuit, there is no compensation at turn-on. In the presence of the turn-on diode $D_3$, selection of a proper value for the resistor $R_{D3}$ allows to fine tune the turn-on of the bottom IGBT 206 independently from its turn-off, the compensation circuit forming a resistive divider between $R_{D3}$ in parallel with $R_9$, this parallel combination being in series with $R_{10}$. It is to be noted that resistor $R_9$ may have an infinite value.

Considering for example a commutation cell formed of the top IGBT 204, its top gate driver 302 and the compensation circuit including the optional turn-on diode $D_4$ and the resistors $R_7$ and $R_8$. When the top IGBT 204 is already turned-on, the output 305 of the top gate driver 302 being at $+V_{cc}$ above the reference 304, it is essentially shorted and its emitter voltage present at the pin 234 is essentially equal to the $+V_{bus}$ voltage. This voltage equal to a voltage at the reference 304 and the turn-on diode $D_4$ is shorted. When the input 303 provides a turn-off command to the gate driver 302, without the compensation circuit, the output 305 would quickly fall to $-V_{dd}$ and the top IGBT 204 would rapidly become an open circuit. The rapid reduction of current flowing therethrough would cause an excessive voltage across the $L_{e-top}$, with the polarity as shown on FIG. 9, causing overvoltage. With the compensation circuit and the present topology, the emitter voltage at the pin 234 reduces below the voltage of the reference 304 and the turn-on diode $D_4$ becomes an open circuit. The voltage across the $L_{e-top}$, between the pins 234 and 236 is divided between the resistors $R_7$ and $R_8$, providing a sample of the overvoltage applied at the reference 304. This sample of the overvoltage across the $L_{e-top}$ is added in series to the $-V_{dd}$ value, effectively slowing down a drop of the voltage $V_{ge}$ between the gate 26 and the emitter 24 of the top IGBT 204 to slow down its di/dt, reducing the overvoltage between its collector 22 and emitter 24.

Upon turn-on of the top IGBT 204, because current starts flowing therethrough, the voltage across the $L_{e-top}$ has a reverse polarity and the emitter voltage at pin 234 increases above the voltage of the reference 304, shorting again the turn-on diode $D_4$, if present. While the output 305 of the top gate driver 302 tends to reach $+V_{cc}$, this rise of voltage applied to the gate 26 is slowed down by application on the reference 304 of the emitter voltage present at the pin 234. This slows down a rise of the voltage $V_{ge}$ between the gate 26 and the emitter 24 and, consequently, of the di/dt through the top IGBT 204. In turn, this reduces the recovery current in the bottom freewheel diode 224.

A commutation cell formed of the bottom IGBT 206, its gate drive 208 and a compensation circuit including the turn-on diode $D_3$, if present, and the resistors $R_9$ and $R_{10}$ operate in the same manner.

The foregoing describes solutions applicable to DC-DC power converters, AC-DC power converters and to DC-AC power converters, for example power modules using a full leg of semiconductors, opposite pairs of power electronic switches and freewheel diodes, to provide alternative current to a connected load such as a motor of an electric vehicle, as well as tri-phase power converters built using three physical layouts as disclosed herein and three pairs of power electronic switches.

Those of ordinary skills in the art will realize that the description of the physical topology for a power converter is illustrative only and are not intended to be in any way limiting. Other embodiments will readily suggest themselves to such persons with ordinary skill in the art having the benefit of the present disclosure. Furthermore, the topology may be customized to offer valuable solutions to existing needs and problems of overvoltage occurring in power electronic switches.

As a non-limiting example, one skilled in the art will understand that the position of the sampling points 226 and 230 onto the trace 216 and 212 could be changed depending on the values of the parasitic inductances required for a particular application.

In the interest of clarity, not all of the routine features of the implementations of the topology are shown and described. It will, of course, be appreciated that in the development of any such actual implementation of the topology, numerous implementation-specific decisions may need to be made in order to achieve the developer's specific goals, such as compliance with application, system, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the topology is not limited in its application to the details of construction and parts illustrated in the accompanying drawings and described hereinabove. The proposed topology is capable of other embodiments and of being practiced in various ways. It is also to be understood that the phraseology or terminology used herein is for the purpose of description and not limitation.

The topology has been described hereinabove by way of illustrative embodiments thereof. The scope of the claims should not be limited by the embodiments set forth in the examples, but should be given the broadest interpretation consistent with the description as a whole.

What is claimed is:

1. A physical topology for receiving top and bottom power electronic switches, each power electronic switch including a collector, a gate and an emitter, the topology comprising:
    a top collector trace connected to a positive voltage power supply tab, the top collector trace having a connection area for the collector of the top power electronic switch;
    a bottom emitter trace connected to a negative voltage power supply tab, the bottom emitter trace having a connection area for the emitter of the bottom power electronic switch;
    a unitary and continuous middle trace connected to a load tab, the middle trace having a connection area for the emitter of the top power electronic switch and a connection area for the collector of the bottom power electronic switch, the middle trace forming a top emitter inductance between the connection area for the emitter of the top power electronic switch and the load tab, the middle trace also forming a bottom collector inductance between the load tab and the connection area for the collector of the bottom power electronic switch;
    a top power electronic switch emitter voltage sampling point located on the middle trace within the connection area for the emitter of the top power electronic switch;
    a bottom power electronic switch collector voltage sampling point located within a connection area of the middle trace to the load tab;
    a bottom power electronic switch emitter voltage sampling point located on the bottom emitter trace within the connection area for the emitter of the bottom power electronic switch; and
    a negative voltage power supply tab sampling point located within a connection area of the bottom emitter trace to the negative voltage power supply tab.

2. The topology of claim 1, wherein:
    the top collector trace forms a top collector inductance; and
    the bottom emitter trace forms a bottom emitter inductance.

3. The topology of claim 2, wherein:
    the top emitter inductance is greater than the top collector inductance and greater than the bottom collector inductance; and
    the bottom emitter inductance is greater than the top collector inductance and greater than the bottom collector inductance.

4. The topology of claim 1, wherein:
    the connection area for the collector of the top power electronic switch and the connection area for the collector of the bottom power electronic switch are configured for direct contact with the collectors of the power electronic switches; and the connection area for the emitter of the top power electronic switch and the connection area for the emitter of the bottom power electronic switch are configured for connection to the emitters of the power electronic switches via wires.

5. The topology of claim 1, wherein:
the top collector trace is configured for mounting a diode in parallel with the top power electronic switch; and
the middle trace is configured for mounting of a diode in parallel with the bottom power electronic switch.

6. The topology of claim 1, wherein:
the top collector trace is configured for mounting a plurality of parallelized top power electronic switches; and
the middle trace is configured for mounting a plurality of parallelized bottom power electronic switches.

7. The topology of claim 6, wherein:
the middle trace includes a groove leading from the top power electronic switch emitter voltage sampling point in a direction toward the load tab to substantially equalize currents in each of the parallelized top power electronic switches; and
the bottom emitter trace includes a groove leading from the bottom power electronic switch emitter voltage sampling point in a direction toward the negative voltage power supply tab to substantially equalize currents in each of the parallelized bottom power electronic switches.

8. The topology of claim 1, wherein the top collector trace, the bottom emitter trace and the middle trace are on a direct bonded copper (DBC) substrate.

9. The topology of claim 8, wherein each of the top power electronic switch emitter voltage sampling point, the bottom power electronic switch collector voltage sampling point, the bottom power electronic switch emitter voltage sampling point and the negative voltage power supply tab sampling point is electrically connected to a respective gate driver connection extending from a plane of the DBC substrate and configured for connection to a separate circuit card.

10. The topology of claim 1, comprising:
a top gate trace configured for connection to the gate of the top power electronic switch via one or more wires; and
a bottom gate trace configured for connection to the gate of the bottom power electronic switch via one or more wires.

11. The topology of claim 10, comprising a pair of gate driver connections respectively extending from the top and bottom gate traces and configured for connection to respective top and bottom gate driver outputs.

12. The topology of claim 1, wherein the load tab is a phase tab.

13. The topology of claim 1, wherein the top and bottom power electronic switches include isolated gate bipolar transistors (IGBT).

14. A power converter, comprising:
the topology and the top and bottom power electronic switches of claim 1;
a top gate driver having a reference electrically connected to the top power electronic switch emitter voltage sampling point and to the bottom power electronic switch collector voltage sampling point; and
a bottom gate driver having a reference electrically connected to the bottom power electronic switch emitter voltage sampling point and to the negative voltage power supply tab sampling point.

15. The power converter of claim 14, wherein:
the reference of the top gate driver is connected to the top power electronic switch emitter voltage sampling point via a first turn-on diode in parallel with a first resistor, the first turn-on diode being polarized to short the first resistor when a voltage of the top power electronic switch emitter is higher than a voltage of the reference of the top gate driver;
the reference of the top gate driver is connected to the bottom power electronic switch collector voltage sampling point via a second resistor;
the reference of the bottom gate driver is connected to the bottom power electronic switch emitter voltage sampling point via a second turn-on diode in parallel with a third resistor, the second turn-on diode being polarized to short the third resistor when a voltage of the bottom power electronic switch emitter is higher than a voltage of the reference of the bottom gate driver;
the reference of the bottom gate driver is connected to the negative voltage power supply tab sampling point via a fourth resistor.

16. A tri-phase power converter comprising three power converters as defined in claim 14.

* * * * *